US009905685B2

(12) United States Patent
Siemieniec et al.

(10) Patent No.: US 9,905,685 B2
(45) Date of Patent: Feb. 27, 2018

(54) SEMICONDUCTOR DEVICE AND TRENCH FIELD PLATE FIELD EFFECT TRANSISTOR WITH A FIELD DIELECTRIC INCLUDING THERMALLY GROWN AND DEPOSITED PORTIONS

(71) Applicant: Infineon Technologies Austria AG, Villach (AT)

(72) Inventors: Ralf Siemieniec, Villach (AT); Oliver Blank, Villach (AT); Mario Kleindienst, Krumpendorf (AT); Stefan Kramp, Villach (AT)

(73) Assignee: Infineon Technologies Austria AG, Villach (AT)

( * ) Notice: Subject to any disclaimer, the term of this patent is extended or adjusted under 35 U.S.C. 154(b) by 2 days.

(21) Appl. No.: 15/139,829

(22) Filed: Apr. 27, 2016

(65) Prior Publication Data

US 2016/0322489 A1   Nov. 3, 2016

(30) Foreign Application Priority Data

Apr. 30, 2015   (DE) .................. 10 2015 106 790

(51) Int. Cl.
| | |
|---|---|
| *H01L 29/78* | (2006.01) |
| *H01L 29/10* | (2006.01) |
| *H01L 29/40* | (2006.01) |
| *H01L 29/06* | (2006.01) |
| *H01L 29/423* | (2006.01) |
| *H01L 29/08* | (2006.01) |
| *H01L 29/51* | (2006.01) |
| *H01L 21/02* | (2006.01) |

(Continued)

(52) U.S. Cl.
CPC ........ *H01L 29/781* (2013.01); *H01L 29/0696* (2013.01); *H01L 29/0865* (2013.01); *H01L 29/1095* (2013.01); *H01L 29/407* (2013.01); *H01L 29/4236* (2013.01); *H01L 29/42376* (2013.01); *H01L 29/513* (2013.01); *H01L 29/7813* (2013.01); *H01L 29/7843* (2013.01); *H01L 21/02164* (2013.01); *H01L 21/02271* (2013.01); *H01L 21/31111* (2013.01); *H01L 29/42368* (2013.01); *H01L 29/7397* (2013.01); *H01L 29/861* (2013.01)

(58) Field of Classification Search
CPC ... H01L 29/78; H01L 29/728; H01L 29/7813; H01L 29/784; H01L 29/7843
USPC ..................................................... 257/330
See application file for complete search history.

(56) References Cited

U.S. PATENT DOCUMENTS

| | | |
|---|---|---|
| 8,558,308 B1 | 10/2013 | Blank |
| 2014/0284773 A1 | 9/2014 | Nishiguchi |
| 2016/0111504 A1* | 4/2016 | Poelzl .................. H01L 29/407 257/330 |

OTHER PUBLICATIONS

Office Action communication of the German Patent and Trademark Office for Appln. Ser. No. 102015106790.0, dated Jan. 19, 2016.

* cited by examiner

*Primary Examiner* — Monica D Harrison
(74) *Attorney, Agent, or Firm* — Baker Botts L.L.P.

(57) ABSTRACT

A semiconductor device includes compensation structures that extend from a first surface into a semiconductor portion. Sections of the semiconductor portion between neighboring ones of the compensation structures form semiconductor mesas. A field dielectric separating a field electrode in the compensation structures from the semiconductor portion includes a thermally grown portion, which directly adjoins (Continued)

the semiconductor portion. A not fully densified deposited portion of the field dielectric has a lower density than the thermally grown portion.

22 Claims, 16 Drawing Sheets

(51) Int. Cl.
*H01L 21/311* (2006.01)
*H01L 29/739* (2006.01)
*H01L 29/861* (2006.01)

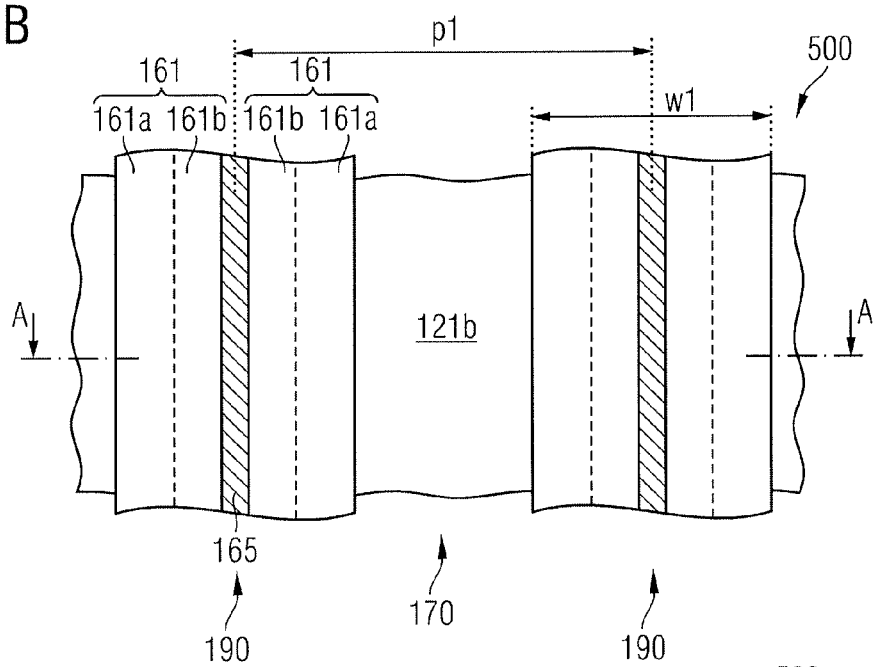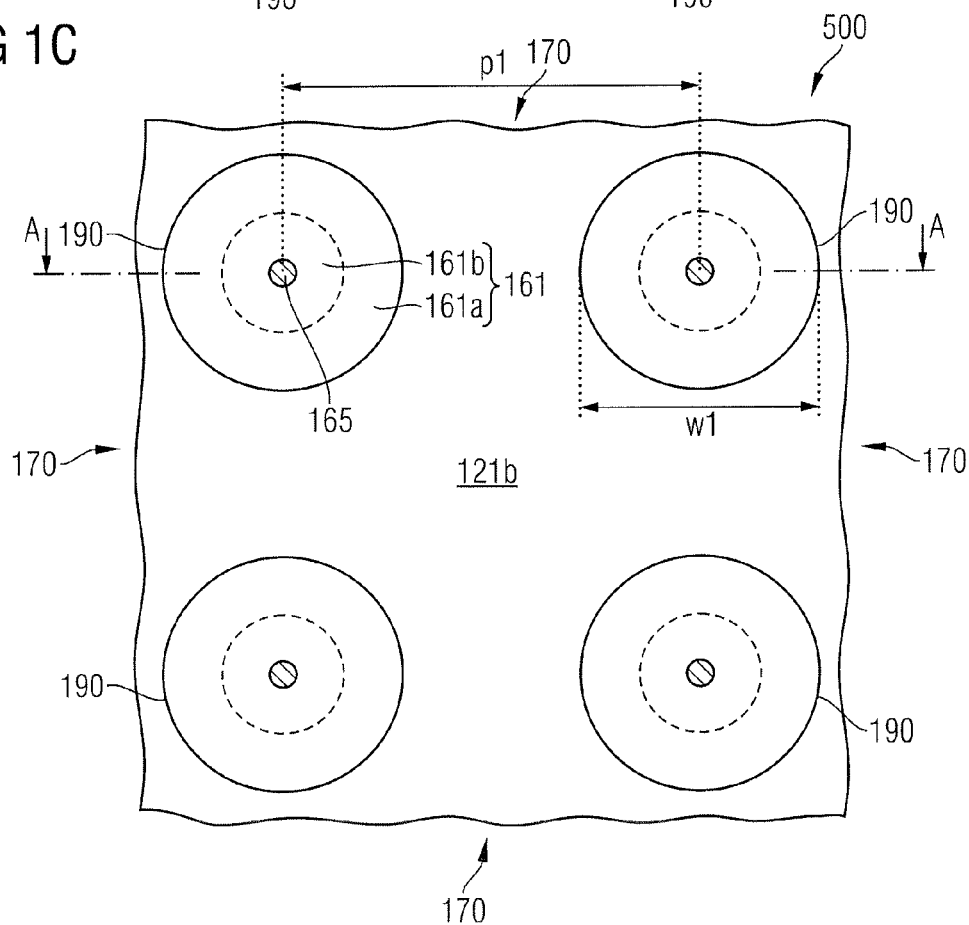

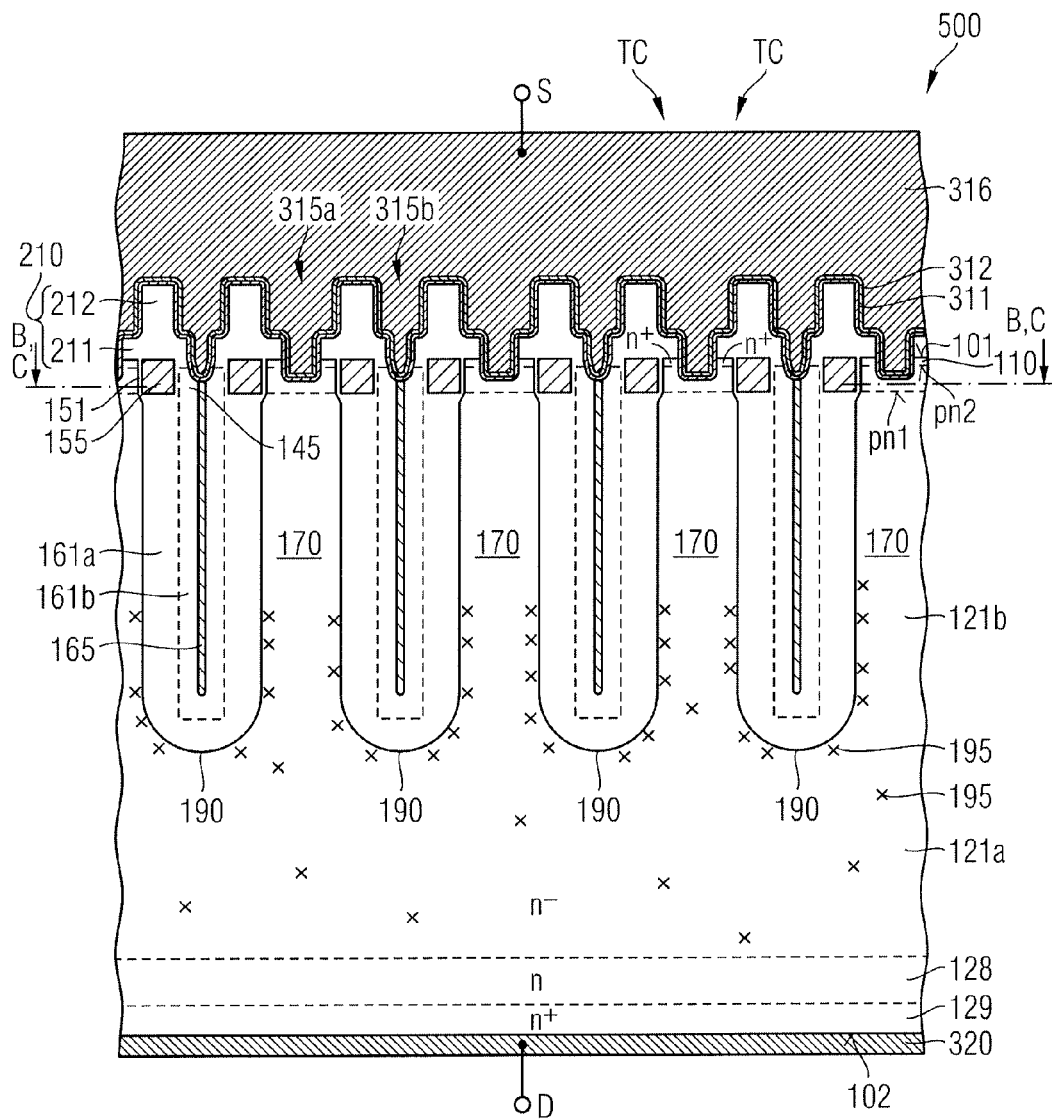

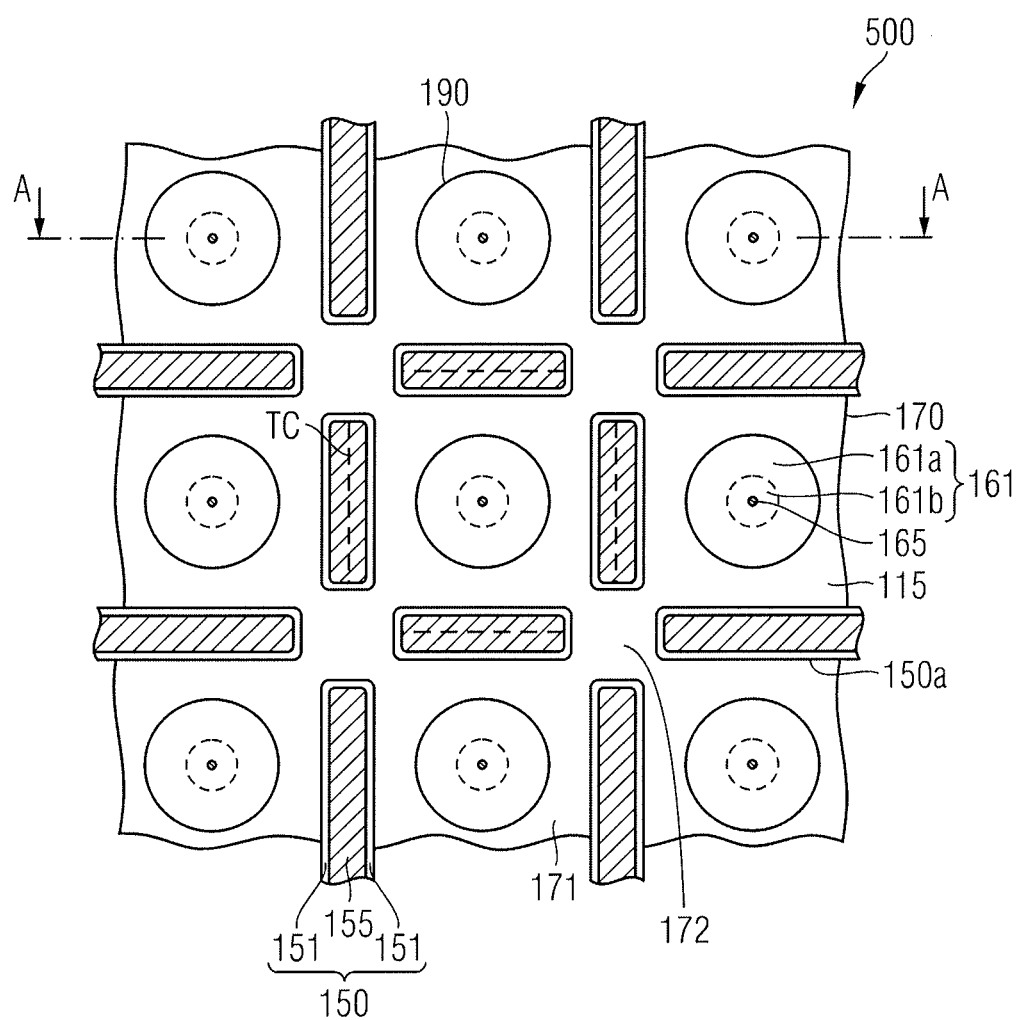

SEMICONDUCTOR DEVICE AND TRENCH FIELD PLATE FIELD EFFECT TRANSISTOR WITH A FIELD DIELECTRIC INCLUDING THERMALLY GROWN AND DEPOSITED PORTIONS

CROSS-REFERENCE TO RELATED APPLICATION

This application claims priority to German Application Serial No. 102015106790.0 filed Apr. 30, 2015 and entitled "Semiconductor Device and Trench Field Plate Field Effect Transistor with a Field Dielectric Including Thermally Grown and Deposited Portions".

BACKGROUND

In trench field plate FETs (field effect transistors) portions of a conductive field plate are buried in a trench extending into the drift zone. In the blocking mode the source potential applied to the field plate depletes portions of the drift zone between the buried field plate portions. The lateral depletion mechanism allows for increasing the dopant concentration in the drift zone without loss of voltage blocking capability. The increased dopant concentration in turn results in a reduced on-state resistance RDSon. The extension of an overlap of the buried field plate portions with the drift zone as well as thickness and quality of a field dielectric separating the buried field plate portions from the drift zone set the total voltage blocking capability of the trench field plate FET.

It is desirable to provide semiconductor devices and trench field plate FETs with high voltage blocking capability.

SUMMARY

According to an embodiment a semiconductor device includes compensation structures extending from a first surface into a semiconductor portion. Sections of the semiconductor portion between neighboring ones of the compensation structures form semiconductor mesas. A field dielectric separates a field electrode in the compensation structures from the semiconductor portion. The field dielectric includes a thermally grown portion which directly adjoins the semiconductor portion as well as a not fully densified deposited portion that has a lower density than the thermally grown portion.

According to an embodiment a trench field plate field effect transistor includes compensation structures extending from a first surface into a semiconductor portion. Sections of the semiconductor portion between neighboring ones of the compensation structures form semiconductor mesas. A field dielectric separates a field electrode in the compensation structures from the semiconductor portion. The field dielectric includes a thermally grown portion which directly adjoins the semiconductor portion as well as a not fully densified deposited portion that has a lower density than the thermally grown portion.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 1B is a schematic horizontal cross-sectional view of the semiconductor device of FIG. 1A along line B,C-B,C according to an embodiment referring to stripe-shaped compensation structures.

FIG. 1C is a schematic horizontal cross-sectional view of the semiconductor device of FIG. 1A along line B,C-B,C according to an embodiment referring to compensation structures arranged in parallel lines.

FIG. 5 is a schematic vertical cross-sectional view of a portion of a semiconductor device according to an embodiment concerning a field stop layer and recombination centers.

FIG. 6C is a schematic horizontal cross-sectional view of the semiconductor device portion of FIG. 6A along line B,C-B,C according to an embodiment concerning spicular field electrode structures and disrupted buried gate electrodes.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or a highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
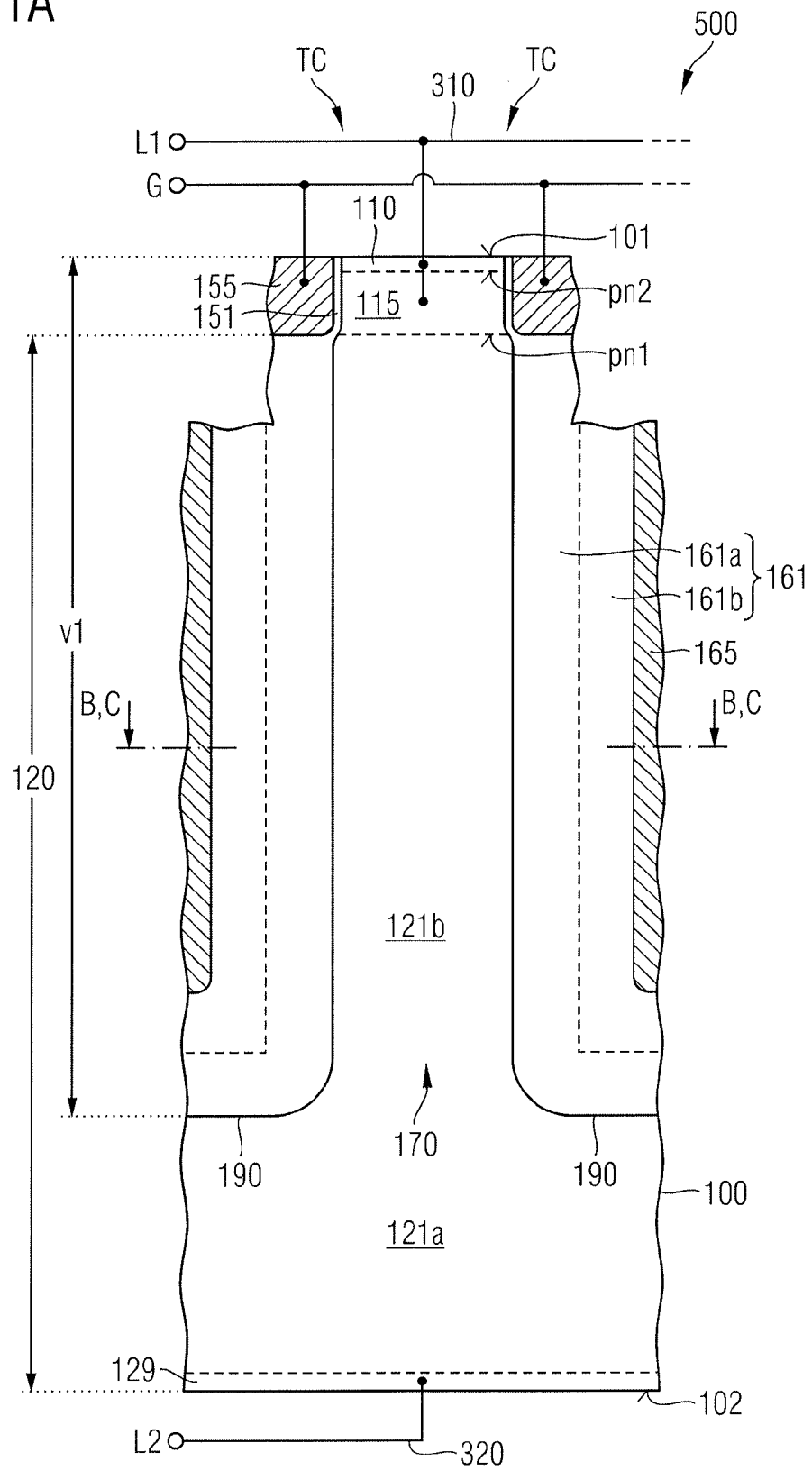
FIG. 1A is a schematic vertical cross-sectional view of a portion of a semiconductor device in accordance with an embodiment concerning a trench field plate FET with a field dielectric including a thermally grown portion and a not fully densified deposited portion.

FIGS. 1A to 1C refer to a semiconductor device 500 including a plurality of identical transistor cells TC. The semiconductor device 500 may be or may include an IGFET (insulated gate field effect transistor), for example a power MOSFET (metal oxide semiconductor FET) in the usual meaning including FETs with metal gates as well as FETs with non-metal gates. For example, the semiconductor device 500 is a trench field plate FET or a smart FET integrating both transistor cells of a trench field plate FET and low voltage transistor cells, e.g., logic and/or driver circuits in CMOS (complementary metal-oxide-semiconductor) technology. According to other embodiments, the semiconductor device 500 may be an IGBT (insulted gate bipolar transistor) or an MCD (MOS controlled diode).

The semiconductor device 500 is based on a semiconductor portion 100 from a crystalline semiconductor material such as silicon (Si).

At a front side, the semiconductor portion 100 has a first surface 101 which may be approximately planar or which may be defined by a plane spanned by coplanar surface sections. On the back of the semiconductor portion 100 a planar second surface 102 runs parallel to the first surface 101. A distance between the first and second surfaces 101, 102 is related to a voltage blocking capability of the semiconductor device 500 and may be at least 40 μm. According to other embodiments, the distance may be in the range of several hundred μm. An outer surface tilted to the first and second surfaces 101, 102 connects the first and second surfaces 101, 102.

In a plane perpendicular to the cross-sectional plane the semiconductor portion 100 may have a rectangular shape with an edge length of several millimeters. A normal to the first surface 101 defines a vertical direction and directions orthogonal to the vertical direction are horizontal directions.

The transistor cells TC are field effect transistor cells with insulated gate and control a load current flowing in a vertical direction between the first surface 101 and the second surface 102. Source electrodes of the transistor cells TC may be electrically connected to a first load electrode 310 at the front side of the semiconductor device 500. The first load electrode 310 may form or may be electrically connected or coupled to a first load terminal L1. Drain electrodes of the transistor cells TC may be electrically connected to a second load electrode 320 on the back of the semiconductor device 500. The second load electrode 320 may form or may be electrically coupled or connected to a second load terminal L2. Gate electrodes of the transistor cells TC are electrically connected or coupled to a gate terminal G.

The semiconductor portion 100 includes a drain structure 120, which is effective as the drain electrode of the transistor cells TC and which is electrically connected to the second load electrode 320. The drain structure 120 includes a drift zone 121, in which a dopant concentration may gradually or in steps increase or decrease with increasing distance to the first surface 101 at least in portions of its vertical extension. According to other embodiments, the dopant concentration in the drift zone 121 may be approximately uniform. A mean dopant concentration in the drift zone 121 may be between $1E15$ $cm^{-3}$ and $1E17$ $cm^{-3}$, for example in a range from $5E15$ $cm^{-3}$ to $5E16$ $cm^{-3}$.

The drain structure 120 further includes a contact portion 129, which may be a heavily doped base substrate or a heavily doped layer. Along the second surface 102 a dopant concentration in the contact portion 129 is sufficiently high to form an ohmic contact with a metal directly adjoining the second surface 102. In case the semiconductor portion 100 is based on silicon, in an n-conductive contact portion 129 the dopant concentration along the second surface 102 may be at least $1E18$ $cm^{-3}$, for example at least $5E19$ $cm^{-3}$. In a p-conductive contact portion 129, the dopant concentration may be at least $1E16$ $cm^{-3}$, for example at least $5E17$ $cm^{-3}$.

The contact portion 129 may directly adjoin the drift zone 121. According to other embodiments, one or more further layers may be sandwiched between the drift zone 121 and the contact portion 129.

The drift zone 121 includes a continuous drift zone section 121a formed in a section of the semiconductor portion 100 between the compensation structures 190 and the contact portion 129, wherein the compensation structures 190 extend from the first surface 101 into the semiconductor portion 100. Sections of the semiconductor portion 100 between the compensation structures 190 form semiconductor mesas 170 that include mesa sections 121b of the drift zone 121. The mesa sections 121b directly adjoin the continuous drift zone section 121a and form first pn junctions pn1 with body zones 115 that extend in the semiconductor mesas 170 between neighboring compensation structures 190. The body zones 115 form second pn junctions pn2 with source zones 110 which are sandwiched between the first surface 101 and the body zones 115.

In n-channel trench field plate FETs, the body zones 115 are p-doped and the source zones 110 as well as the drift zone 121 are n-doped. P-channel trench field plate FETs include n-doped body zones 115 and p-doped source zones 110 as well as a p-doped drift zone 121.

The compensation structures 190 may have approximately vertical sidewalls or may slightly taper with increasing distance to the first surface 101, for example, at a taper angle of about 1 degree with respect to the vertical direction. The sidewalls of the compensation structures 190 may be straight or slightly bulgy. End portions of the compensation structures 190 oriented to the second surface 102 may include flat portions parallel to the first surface 101 or may be bowed, for example approximately semi-circular.

A mean width w1 of the compensation structures 190 at the first surface 101 may range from 0.2 µm to 10 µm, for example from 1 µm to 4 µm. A vertical extension v1 of the compensation structures 190 may be in a range from 0.5 µm to 30 µm, e.g., in a range from 3 µm to 10 µm. A center-to-center distance (pitch) p1 of the compensation structures 190 may be in a range from 0.5 µm to 10 µm, for example from 1.5 µm to 5 µm.

As illustrated in FIG. 1B the compensation structures 190 may be stripes extending along a horizontal direction at a distance to each other given by the pitch p1 and the horizontal extension w1.

FIG. 1C refers to an embodiment with the compensation structures 190 separated from each other along the lines, such that along each line a plurality of identical compensation structures 190 are formed. The dot-shaped compensation structures 190 may be arranged matrix-like in lines and rows as illustrated. According to other embodiments, the compensation structures 190 in odd lines may be shifted to the compensation structures 190 in even lines, e.g., by half the pitch p1.

Horizontal cross-sections of the compensation structures 190 may be elongated, wherein the second horizontal dimension exceeds the first horizontal dimension by at least 20%, e.g., at least 50%. For example the cross-sections may be ellipses, ovals or distorted polygons with or without rounded or beveled corners, respectively.

According to an embodiment the compensation structures 190 may be spicular (needle-shaped), wherein a second horizontal dimension exceeds a first horizontal dimension orthogonal to the second horizontal dimension by at most 500% and the vertical extension v1 exceeds the second horizontal dimension. For example, the second horizontal dimension exceeds the first horizontal dimension by at most 100% and the vertical extension v1 exceeds the second horizontal dimension by at least 100%.

The first and second horizontal dimensions may be approximately equal and the cross-sections of the compensation structures 190 may be rotational symmetric and look the same after a rotation by at least one rotation angle smaller than 360 degree. For example, the cross-sections are regular polygons such as octagons, hexagons or squares, with or without rounded or beveled corners, respectively. According to another embodiment, the cross-sections of the compensation structures 190 are circles.

The compensation structures 190 may include portions of a gate electrode 155 as well as portions of a gate dielectric 151 separating the gate electrode 155 from the body zones 115. The gate electrode 155 may be embedded in the compensation structure 190. According to other embodiments, portions of the gate electrode 155 are spaced from the compensation structures 190 by first mesa sections of the semiconductor mesas 170, wherein the first mesa sections include the source zones 110 as well as the body zones 115. The gate electrode 155 includes or consists of a heavily doped polycrystalline silicon material and/or a metal containing material.

The gate dielectric 151 may include or consist of a thermal portion resulting from a thermal oxidation and/or nitridation of the semiconductor material of the semiconductor portion 100, e.g., a semiconductor nitride layer, a semiconductor oxide layer or a semiconductor oxynitride layer. In addition to the thermal portion, the gate dielectric 151 may include one or more further layers of dielectric materials such as deposited semiconductor oxide, for example, deposited silicon oxide such as silicon oxide formed by using TEOS (tetraethyl orthosilicate) as precursor material in an LPCVD (low pressure chemical vapor deposition), an APCVD (atmospheric pressure chemical vapor deposition) or PECVD (a plasma enhanced chemical vapor deposition) process at deposition temperatures typically at about and below 500° Celsius.

The gate dielectric 151 capacitively couples the gate electrode 155 to the body zones 115. In channel portions of the body zones 115 directly adjoining the gate dielectric 151 a potential applied to the gate terminal G may accumulate minority charge carriers to form conductive channels along the gate dielectric 151 between the source zones 110 and the drift zone 121 in an on-state of the transistor cell TCs.

The compensation structures 190 further include a field electrode 165 and a field dielectric 161 that separates the field electrode 165 from the drift zone 121. The field electrode 165 is separated from the gate electrode 155 and includes or consists of a heavily doped polycrystalline silicon material and/or a metal containing material.

The field dielectric 161 embeds the gate electrode 155 which is formed between the first surface 101 and an outer portion of the field dielectric 161 in a vertical projection of the latter.

The field dielectric 161 includes at least a thermally grown portion 161a and a deposited but not fully densified portion 161b. The thermally grown portion 161a results from a thermal oxidation of the semiconductor material of the semiconductor portion 100. The not fully densified deposited portion 161b has a lower density than the thermally grown portion 161a and a lower density as it would have if it was fully densified by a suitable heating treatment, e.g., by an anneal at 1100° Celsius for 30 minutes. The field dielectric 161 may include a further layer, e.g., a further thermal oxide portion on the not fully densified portion 161b.

A mean ratio of a thickness of the thermally grown portion 161a to the total thickness of the field dielectric is at least 50% and at most 90%. According to an embodiment, the mean ratio is at least 55%. For example, the thickness of the thermally grown portion 161a is about 600 nm and the thickness of the not fully densified deposited portion 161b is about 400 nm.

According to an embodiment, the thermally grown portion 161a is thermally grown silicon oxide and has a density (volumetric mass density) of about 2.27 g/cm$^3$. The refractive index is 1.46 and the relative permittivity is about 3.8 to 3.9.

The not fully densified deposited portion 161b is a silicon oxide layer obtained by a deposition process, e.g., LPCVD, APCVD, or PECVD, wherein after deposition the deposited silicon oxide is not densified in a heating treatment at or above 1100° C. but at a temperature of at most 1050° C. In this context, the term "not fully" or "not completely" concerns the internal structure of the complete deposited portion 161b over its whole extension and thickness.

The not fully densified deposited portion 161b has a lower density than the thermally grown portion 161a and a lower density than a fully densified deposited oxide, wherein deposited oxide is defined to be fully densified after a heating treatment at 1100° C. for 30 minutes.

According to an embodiment, the density of the deposited portion 161b is at most 98% of that of a fully densified deposited oxide, for example at most 97%.

Thermally grown silicon oxide grows on the regular silicon crystal with no other elements involved. The silicon oxide grows highly ordered and the volumetric mass density is comparatively high. On the other hand, directly after deposition, deposited silicon oxide ("CVD oxide") resulting from LPCVD, APCVD, or PECVD is amorphous or shows only sparse molecular order, is more porous and typically contains other constituents of the precursor materials such as hydrogen, e.g., in Si—(OH) bonds. Directly after deposition, the density of the deposited portion depends on the precursor material and the process conditions.

The difference in density between the thermally grown portion 161a and the not fully densified deposited portion 161b results in different etching resistance and etch rates. For example, in an etch solution containing buffered hydrofluoric acid, e.g., an about 8:1 mixture of 33 wt. % ammonium fluoride NH$_4$F and 4.15 wt. % hydrofluoric acid HF, the etch selectivity between the not fully densified deposited portion 161b and a fully densified deposited silicon oxide is in a range from 2:1 to 4:1, e.g., between 2:1 and 3:1.

Typically a fully densified deposited silicone oxide approximates to a high degree a thermally grown silicon oxide with respect to density, hydrogen content and etch resistance. According to an embodiment, in an etch solution containing buffered hydrofluoric acid with 33 wt. % ammonium fluoride NH$_4$F and 4.15 wt. % hydrofluoric acid HF the etch selectivity between the not fully densified deposited portion 161b and the thermally grown portion 161a is in a range from 2:1 to 4:1, e.g., between 2:1 and 3:1.

The hydrogen content in the not fully densified deposited portion 161b is higher than in the thermally grown portion 161a and higher than in a fully densified deposited silicon oxide layer, but lower than in a silicon oxide layer directly after deposition.

Due to the lower density, a mechanical stress induced into the semiconductor portion 100 by the not-fully densified deposited portion 161b is opposite to the mechanical stress induced into the semiconductor portion 100 by the thermally grown portion 161a.

The multilayer field dielectric 161 including the not completely densified dielectric portion 161b significantly reduces stress-induced bowing of a semiconductor wafer on which a plurality of identical ones of the semiconductor devices 500 are manufactured.

In a production line, wafer bowing is acceptable only up to a certain degree. The degree of wafer bowing increases with increasing thickness of the field dielectric 161, which induces mechanical stress into the surrounding semiconductor material, and with increasing vertical extension v1 of the compensation structures 190.

The multilayer field dielectric 161 including a not completely densified deposited portion 161a allows for increasing the vertical extension v1 of the compensation structures 190 and for a thicker field dielectric 161 without increasing wafer bowing to beyond an admissible degree. As a consequence, the multilayer field dielectric 161 with a not completely densified deposited portion 161b allows for expanding the application of the trench field plate concept for semiconductor devices 500 to higher blocking capabilities.

In addition, the highly conformal deposited portion 161b compensates for thickness variations in the thermally grown portion 161a.

Figure 2A:
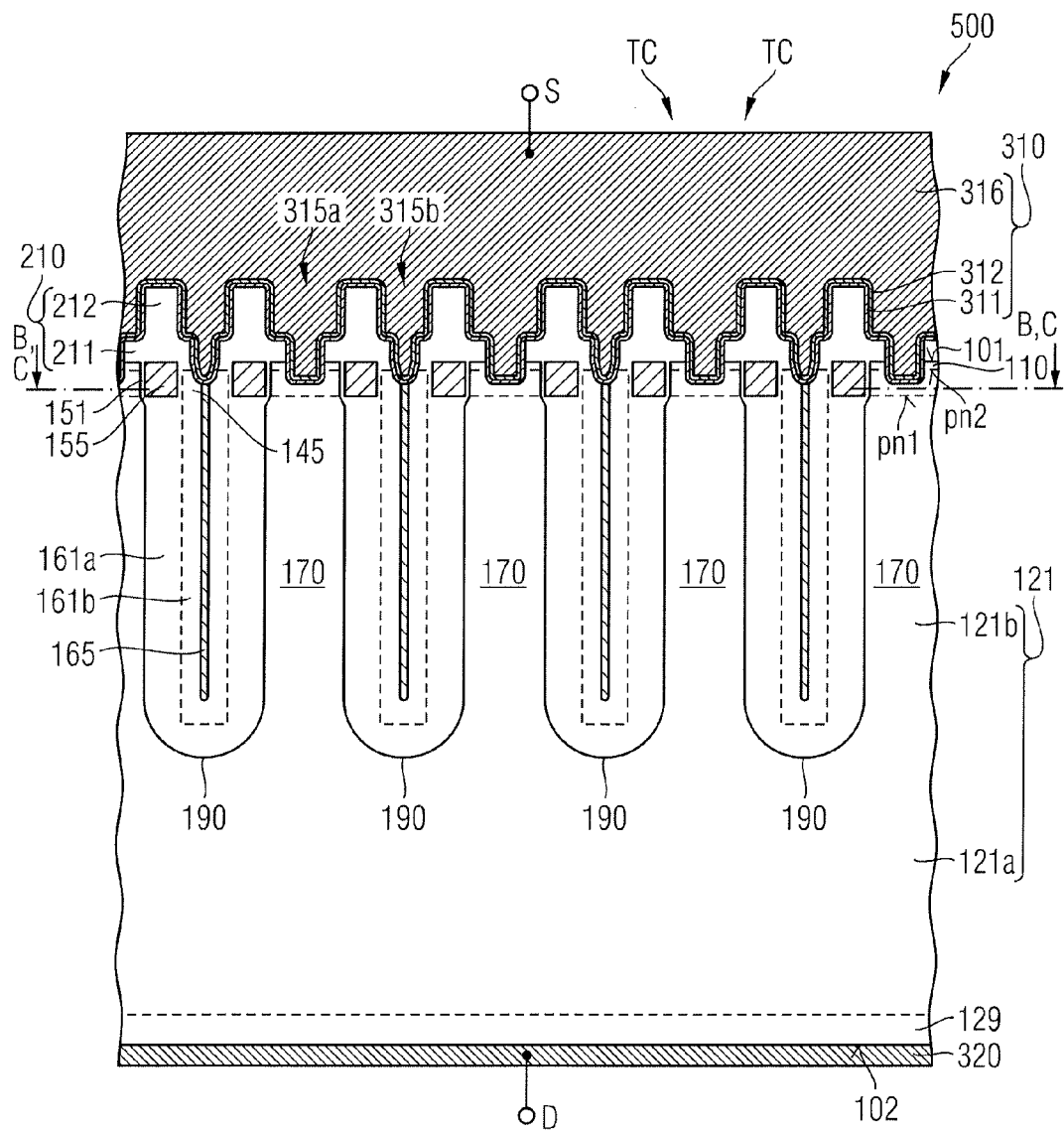
FIG. 2A is a schematic vertical cross-sectional view of a portion of a semiconductor device in accordance with an embodiment including a directly connected field electrode.
Figure 2B:
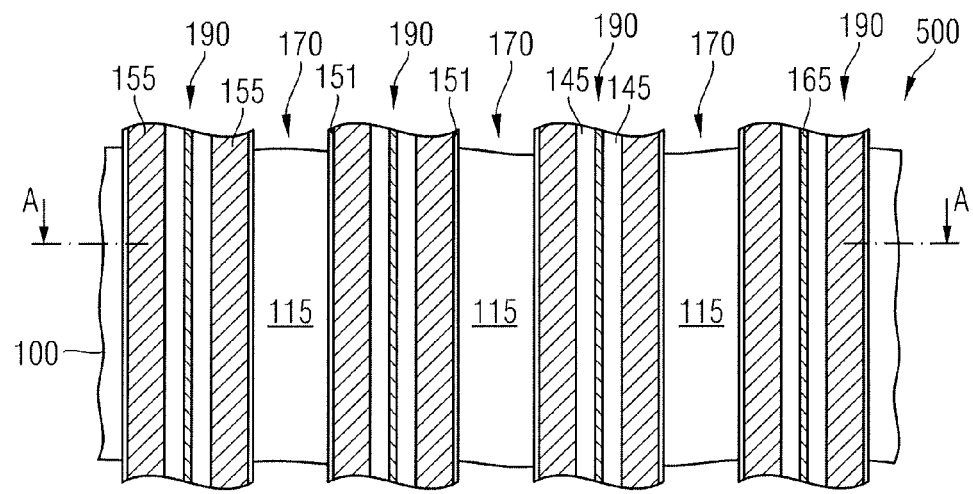
FIG. 2B is a schematic horizontal cross-sectional view of the semiconductor device of FIG. 2A along line B,C-B,C according to an embodiment referring to stripe-shaped compensation structures.

FIGS. 2A to 2B concern an embodiment with a directly connected field electrode 165.

The semiconductor device 500 may be a trench field plate FET, wherein the first load electrode 310 may form or may be electrically coupled or connected to a source terminal S and the second load electrode 320, which directly adjoins the second surface 102, may form or may be electrically connected to a drain terminal D.

Each of the first and second load electrodes 310, 320 may consist of or contain, as main constituent(s), aluminum (Al), copper (Cu), or alloys of aluminum or copper, for example AlSi, AlCu or AlSiCu. According to other embodiments, at least one of the first and second load electrodes 310, 320 may contain, as main constituent(s), nickel (Ni), tin (Sn), titanium (Ti), tungsten (W), tantalum (Ta), vanadium (V), silver (Ag), gold (Au), platinum (Pt), and/or palladium (Pd). For example, at least one of the first and second load electrodes 310, 320 may include two or more sub-layers, wherein each sub-layer contains one or more of Ni, Sn, Ti, V, Ag, Au, Pt, W, and Pd as main constituent(s), e.g., a silicide, a nitride and/or an alloy.

According to the illustrated embodiment, the first load electrode 310 includes a conductive interface layer 311 from a transition nitride, for example titanium nitride with a thickness of some few nanometers. A tungsten layer 312 with a thickness of at least 10 nm covers the conductive interface layer 311. A main portion 316 may be formed from copper or aluminum or a combination of both.

An interlayer dielectric 210 may separate the gate electrodes 155 and the first load electrode 310. The interlayer dielectric 210 may include one or more dielectric layers 211, 212 from silicon oxide, silicon nitride, silicon oxynitride, doped or undoped silicate glass, for example BSG (boron silicate glass), PSG (phosphorus silicate glass) or BPSG (boron phosphorus silicate glass), by way of example.

Contact structures 315a, 315b extend through openings in the interlayer dielectric 210 and electrically connect the first load electrode 310 with the field electrodes 165 as well as with the source zones 110 and the body zones 115 of the transistor cells TC.

The contact structures 315a, 315b may include one or more conductive interface layers 311 containing a transition metal, for example titanium (Ti) or tantalum (Ta), for example a titanium nitride layer. The contact structures 315, 315b may further include a tungsten layer 312.

As illustrated in FIG. 2A, in each compensation structure 190 the field electrode 165 is accessible between segments or portions of the gate electrode 155 formed on opposite sides of the field electrode 165. For example, the field electrode 165 may extend up to a plane coplanar with the first surface 101. According to the illustrated embodiment, a field plate contact structure 315b extends down to the field electrode 165 in each compensation structure 190.

As illustrated in FIG. 2B in stripe-shaped compensation structures 190 each compensation structure 190 includes two segments of the gate electrode 155 on opposite sides. A portion of the field electrode 165 or a field plate contact structure 315b extending from the first load electrode 310 to the field electrode 165 passes through the gap between the two segments of the gate electrode 155, wherein an intermediate dielectric 145 is sandwiched between the gate electrode 155 at one side and the combination of field electrode 165 and field plate contact structure 315b at the other side.

The trench field plate contact structure 315b may extend along almost the complete longitudinal extension of the compensation structure 190, such that each horizontal portion of the field electrode 165 has a direct, vertical electrical connection to the first load electrode 310.

Figure 2C:
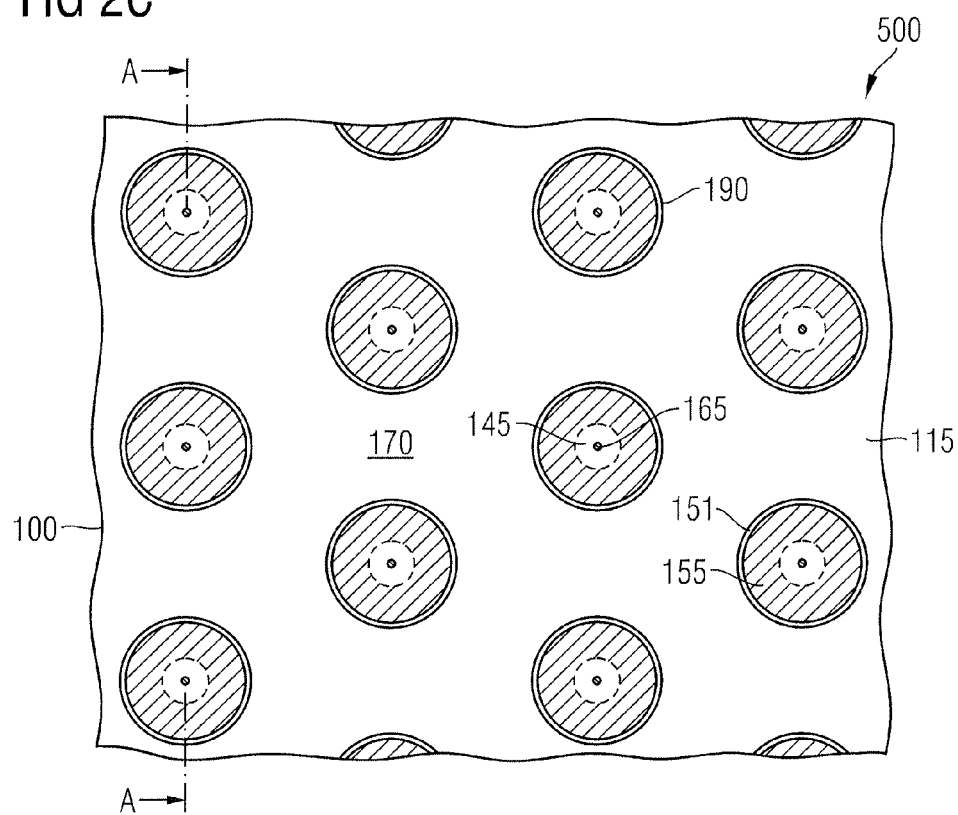
FIG. 2C is a schematic horizontal cross-sectional view of the semiconductor device of FIG. 2A along line B,C-B,C according to an embodiment referring to compensation structures arranged in parallel lines.

For spicular compensation structures 190 as illustrated in FIG. 2C, in each compensation structure 190 the gate electrode 155 surrounds the field electrode 165 and/or the respective trench field plate contact structure 315b extending between the first load electrode 310 and the field electrode 165. Each field electrode portion 165 has a direct vertical connection to the first load electrode 310.

In conventional layouts, the field electrode 165 is typically connected to the first load electrode 310 only in a connection area outside an active transistor cell field such that a significant voltage drop may occur along the longitudinal extension of a stripe-shaped compensation structure 190. When a conventional trench field plate FET switches on or off, the output capacity is discharged and recharged and a charging current of the output capacity flows along the longitudinal direction of the field electrodes 165. With increasing switching speed, the resistivity of the field electrode 165 becomes more effective such that the unloading/loading or discharging/charging process may have already finished in a region of the transistor cell field close to the edge whereas in a region close to the center a change of the charge of the output capacity has not yet taken place. If at this time the voltage across the semiconductor device 500 is sufficiently high, a dynamic avalanche can occur where the charging process is still in process. The dynamic avalanche increases the switching losses and may also result in a fatal destruction of the semiconductor device 500. By contrast, the direct vertical connection between all portions of the field electrode 165 and the first load electrode 310 avoids any voltage drop across the longitudinal axis of the compensation structures 190, reduces switching losses and improves avalanche ruggedness of the semiconductor device 500.

Figure 2D:
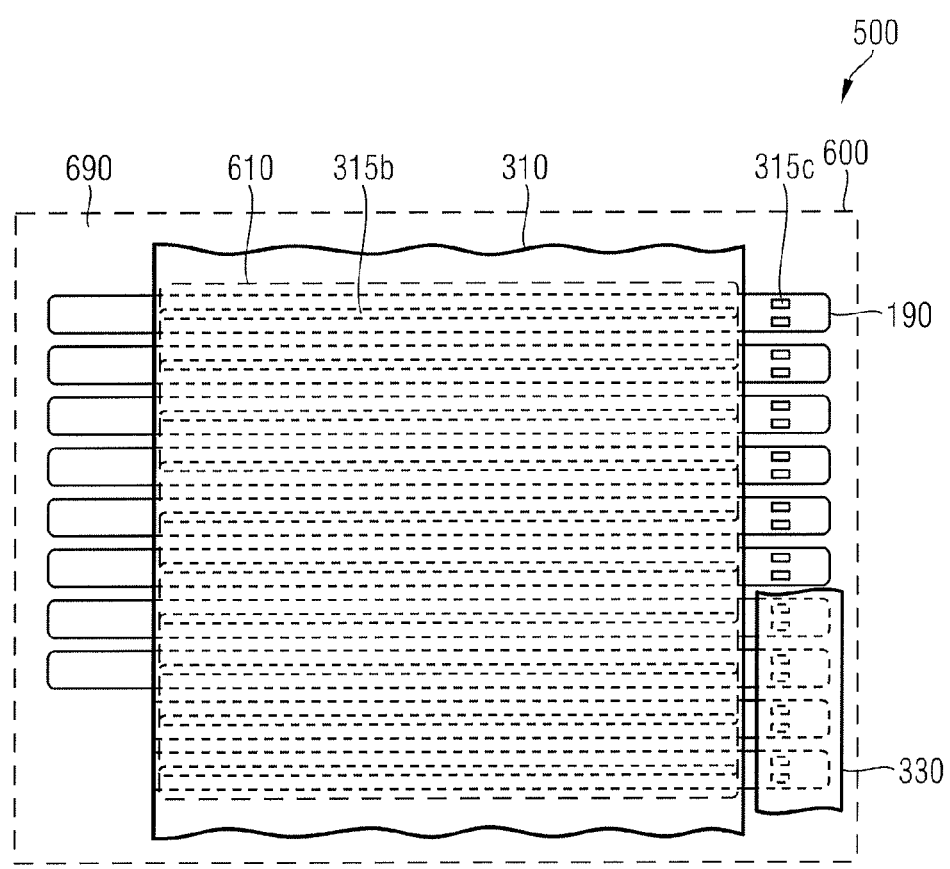
FIG. 2D is a schematic plan view of a transistor cell field of a semiconductor device according to another embodiment referring to stripe-shaped compensation structures and directly connected field electrodes in the transistor cell field.

FIG. 2D shows a portion of a semiconductor device 500 including an active field 600. The active field 600 includes an active transistor cell field 610 and a connection area 690 surrounding the transistor cell field 610. Stripe-shaped compensation structures 190 extend through the transistor cell field 610 and into adjoining portions of the connection area 690. In the connection area 690 gate contacts 315 extend through the interlayer dielectric down to the two segments of the gate electrode portions of each compensation structure 190 and electrically connect the gate electrode with a gate conductor 330.

A source metallization forming the first load electrode 310 is formed in the vertical projection of the transistor cell field 610 side-by-side to the gate conductor 330 at a first side of the semiconductor device 500. Stripe-shaped trench field plate contact structures 315b electrically connect the source metallization with the portions of the field electrode in the compensation structures 190. The stripe-shaped trench field plate contact structures 315b may be continuous structures extending through at least the greater portion of the transistor cell field 610. According to other embodiments a plurality of separated trench field plate contact structures 315b may be assigned to each single compensation structure 190 within the active transistor cell field 610.

Figure 3A:
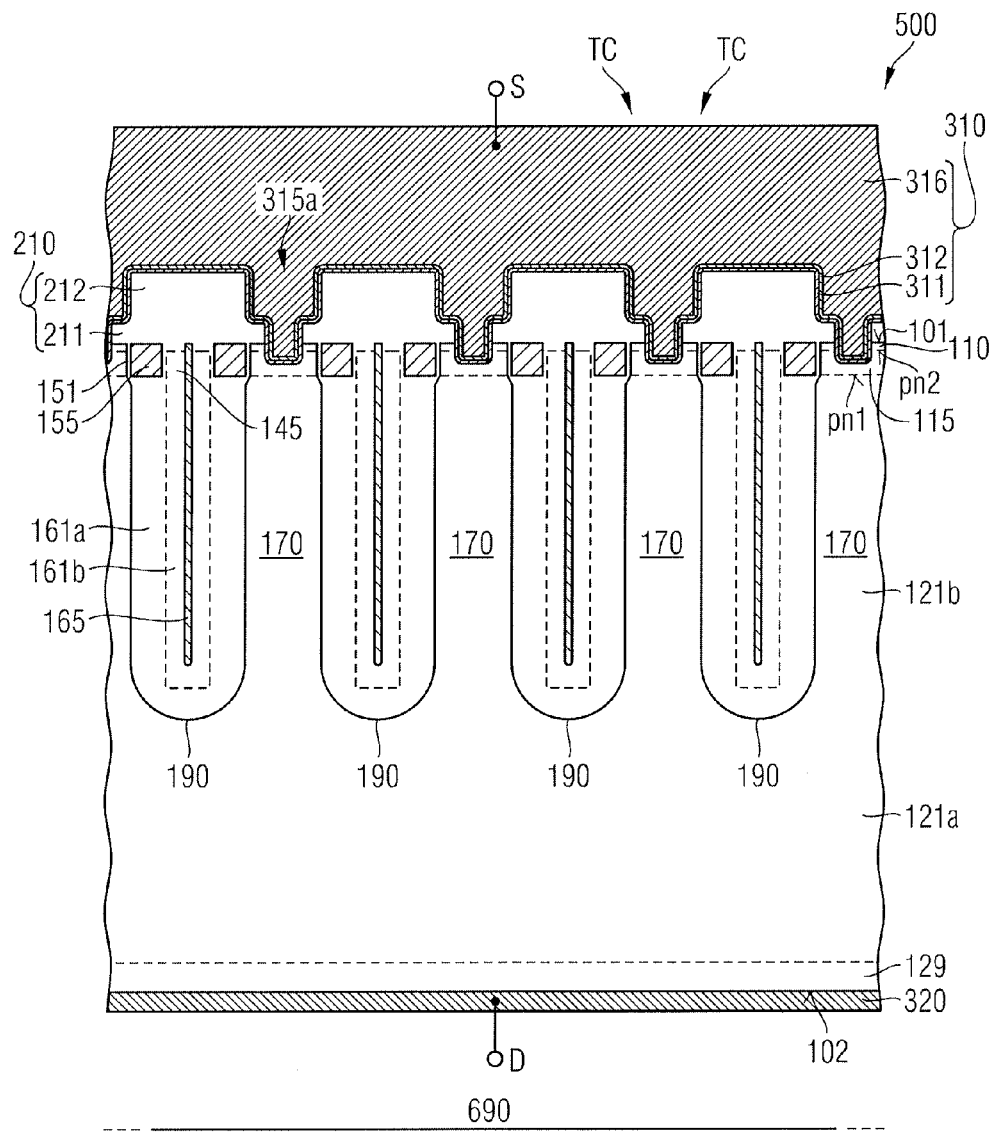
FIG. 3A is a schematic vertical cross-sectional view of a portion of a semiconductor device according to an embodiment referring to a field electrode electrically connected in an edge region and separating two gate segments in each compensation structure.

FIG. 3A refers to an embodiment with the field electrode 165 electrically connected to the first load electrode 310 in a connection area outside a transistor cell field 610. Within the transistor cell field 690 the field electrode 165 may extend to or almost to the first surface 101 and each compensation structure 190 may include two gate electrode segments on opposite sides of the intermediate field electrode 165. An intermediate dielectric 145 separating the gate and field electrodes 155, 165 may be formed from a portion of a dielectric structure from which the field dielectric 161 is formed. For further details, reference is made to the description of FIGS. 1A to 2C.

Figure 3B:
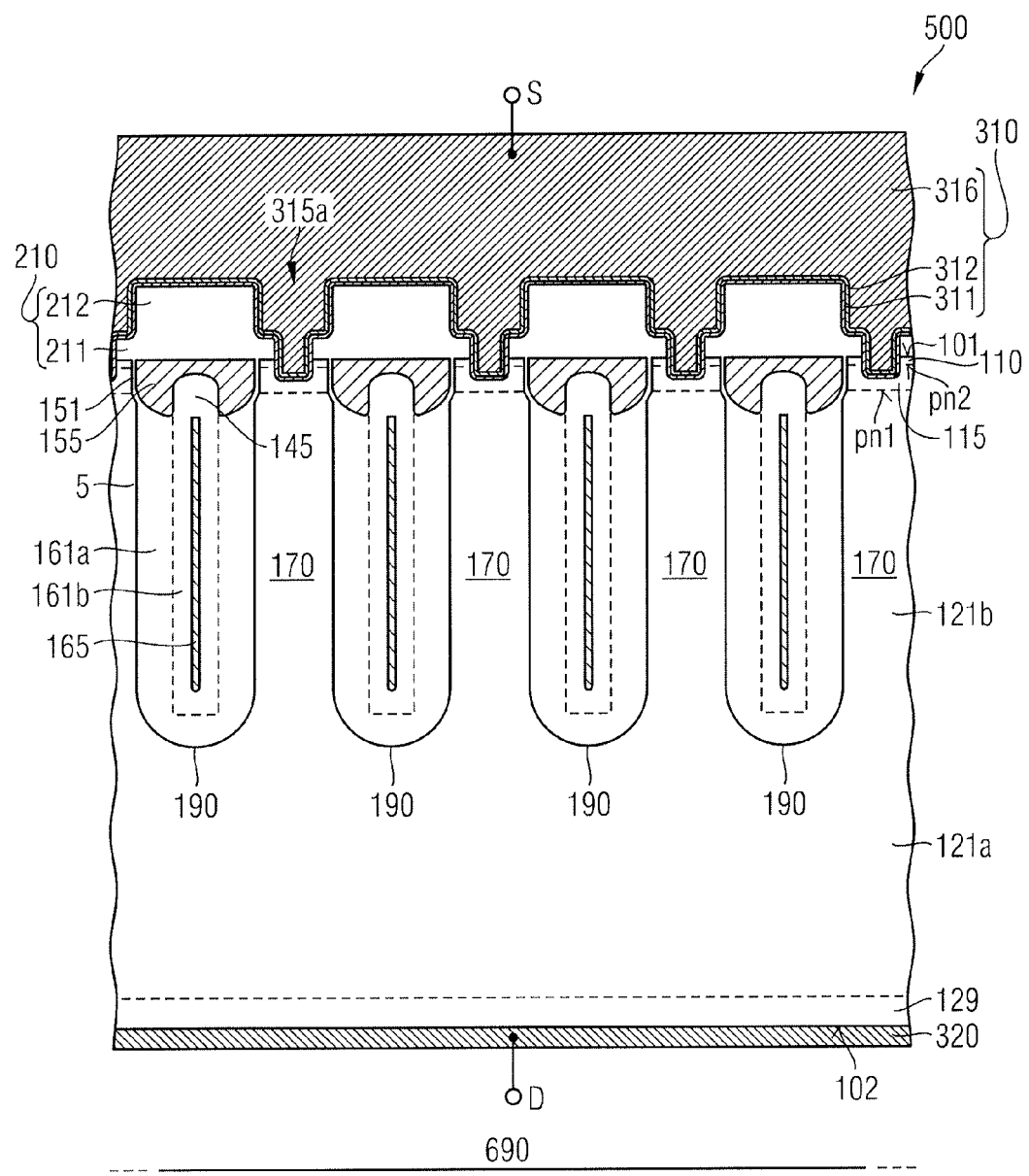
FIG. 3B is a schematic cross-sectional view of a portion of a semiconductor device in accordance with an embodiment referring to a field electrode formed below a non-segmented gate electrode with two gate lobes.

FIG. 3B refers to an embodiment with the field electrode 165 formed in a distance to the first surface 101. In each compensation structure 190, two gate lobes on opposite sides are connected by a thinned portion in the vertical projection of the field electrode 165 and form one continuous gate electrode 155 in each compensation structure 190. The intermediate dielectric 145 may be formed by oxidation of a portion of the field electrode 165.

Figure 4:
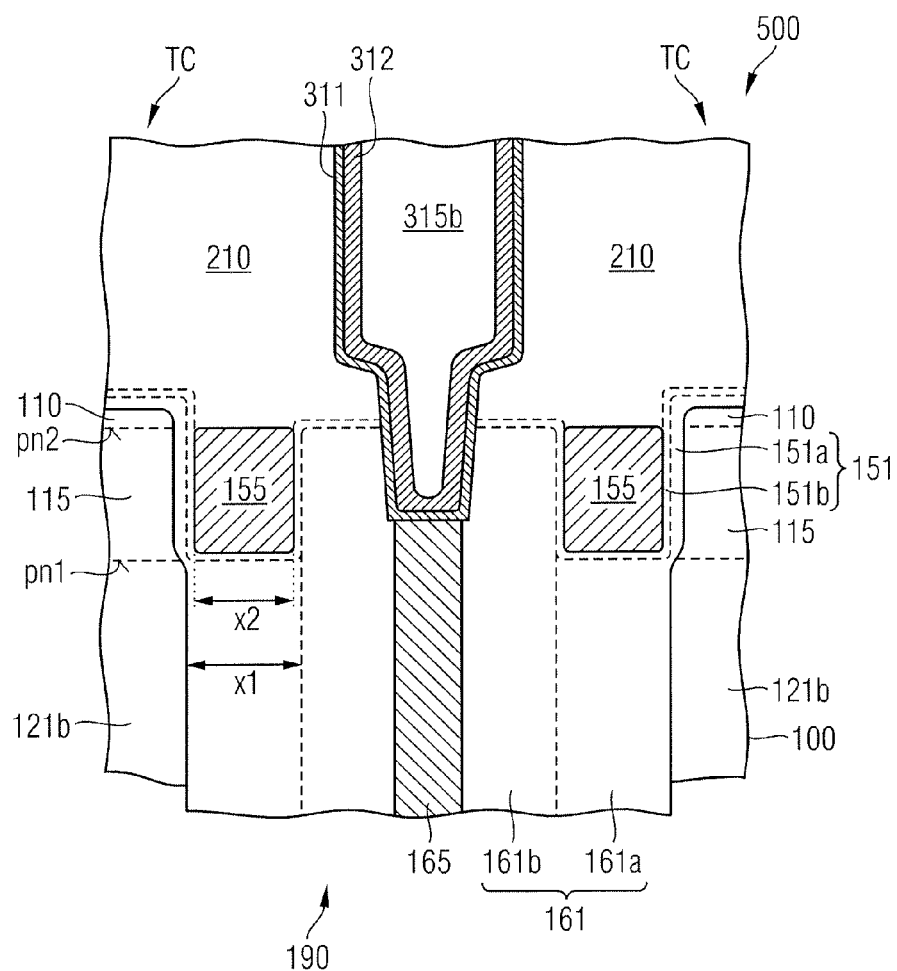
FIG. 4 is a schematic vertical cross-sectional view of a portion of a semiconductor device according to an embodiment referring to gate dielectrics with a thermal and a non-thermal portion.

FIG. 4 shows a semiconductor device 500 with a gate dielectric 151 that consists of or includes a thermal portion 151a, e.g., from thermally grown silicon oxide and a non-thermal portion 151b of, e.g., deposited silicon oxide. The gate dielectric 151 may include a further thermal portion formed on a side of the non-thermal portion 151b opposite to the thermal portion 151a. The thermal portion 151a may be grown at a temperature below 1000° C. to save the characteristics of the not fully densified deposition portion 161b of a previously formed field dielectric 161. The non-thermal portion 151b may be highly conformal to compensate for thickness variations of the thermal portion 151a. The non-thermal portion 151b is not fully densified and may have a lower density than the thermal portion 151a and as a fully densified deposited silicon oxide based on TEOS. While the thermally grown portion 151a may show thickness variations along edges, for example thin portions along a lower edge oriented to the field dielectric 161, the non-thermal portion 151b has a highly uniform layer thickness and compensates for thickness variations of the thermal portion 151a.

A horizontal width x2 of the portions of the gate electrodes 155 may be approximately equal to or slightly smaller than a width x1 of the not fully densified deposited portion 161b of the field dielectric 161 such that the gate electrode 155 and the gate dielectric 151 can be formed in a recess formed by a selective etch of the not fully densified portion 161b with respect to the thermally grown portion 161a. As regards further details, reference is made to the description of the previous figures.

In the semiconductor device 500 of FIG. 5, the drain structure 120 includes a field stop layer 128 sandwiched between the drift zone 121 and the contact portion 129 and forming a unipolar homojunction with the drift zone 121a. A mean dopant concentration in the field stop layer 128 may be at least two times as high as a mean impurity concentration in the drift zone 121 and may be at most one fifth of a maximum dopant concentration in the contact portion 129. In case of an avalanche event, the electric field may extend into the field stop layer 128 and prevents or delays a local increase of the electric field strength at the side of the second load electrode 320. A vertical extension of the field stop layer may be about 5 µm and a mean dopant concentration may be in a range from 5E15 cm$^{-3}$ to 5E17 cm$^{-3}$, for example about 5E16 cm$^{-3}$.

Alternatively or in addition, the semiconductor portion 100 may include metallic recombination centers 195 for reducing the charge carrier lifetime in the drift zone 121. The recombination centers 195 may be platinum atoms. The recombination centers 165 reduce the number of charge carriers which have to be discharged from the semiconductor portion 100 when the semiconductor device 500 changes from conducting body diode mode to a blocking mode.

As described with reference to the previous FIGS., the gate electrode 155 may be formed in recesses of the field dielectric 165. The following FIGS. 6A to 6C refer to semiconductor devices 500 with the gate electrode 155 formed in a horizontal distance to the compensation structures 190.

Figure 6A:
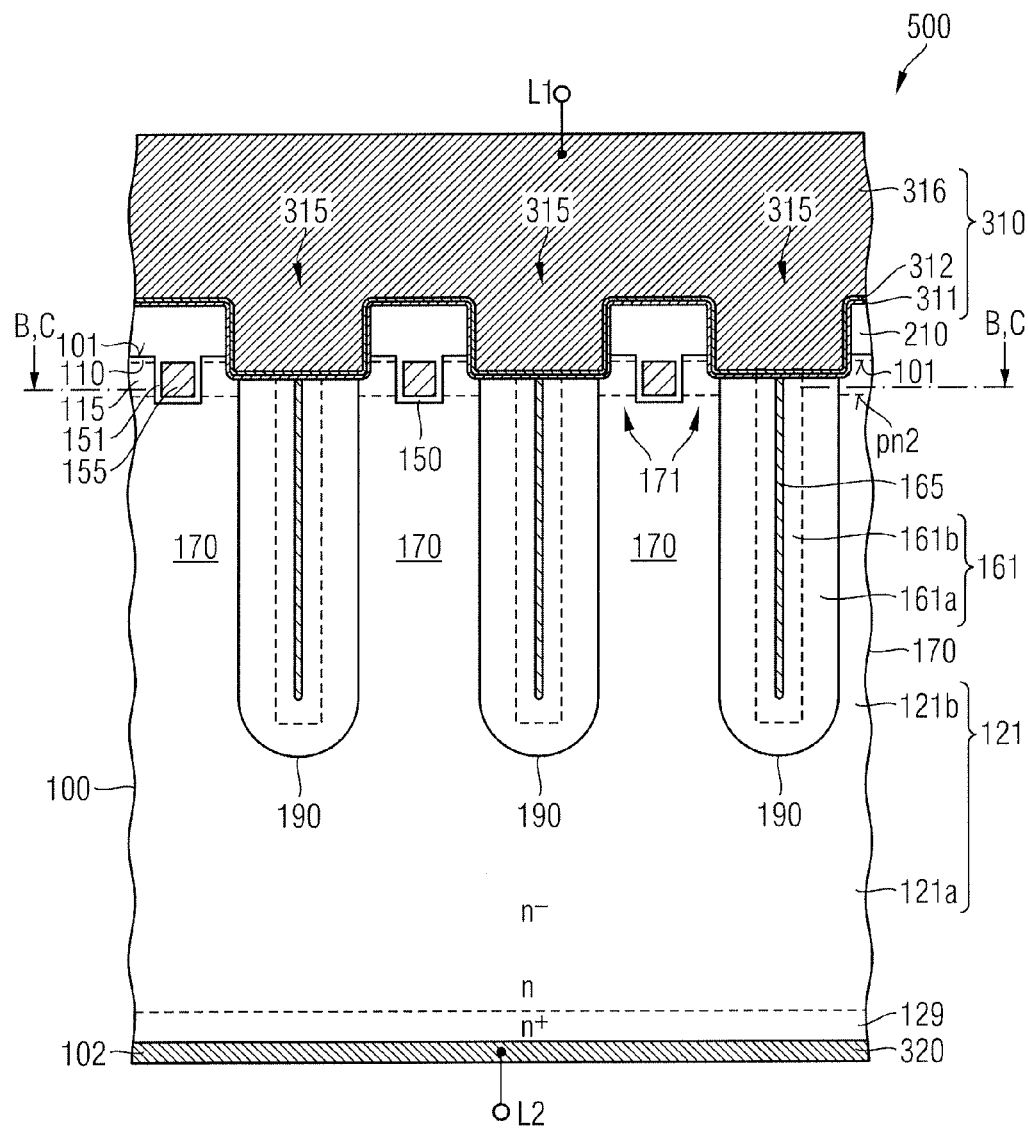
FIG. 6A is a schematic vertical cross-sectional view of a portion of a semiconductor device according to an embodiment concerning gate electrodes outside the compensation structure.

As illustrated in FIG. 6A first mesa sections 171 of the semiconductor mesas 170 separate gate structures 150 including the gate electrode 150 and the gate dielectric 151 from the compensation structures 190, wherein the first mesa sections 171 include the source zones 110 as well as the body zones 115. Contact structures 315 electrically connect field electrodes 165, source zones 110 and body zones 115 with a first load electrode 310. As regards further details, reference is made to the description of the previous FIGS.

Both the gate structures 150 and the compensation structures 190 may be stripe-shaped and arranged in parallel to each other. According to another embodiment, the gate structures 150 may be stripe-shaped or may include buried gate segments arranged along straight gate lines, whereas the compensation structures 190 are spicular compensation structures arranged in compensation lines parallel to the stripe-shaped gate structures 150 or the gate lines.

Figure 6B:
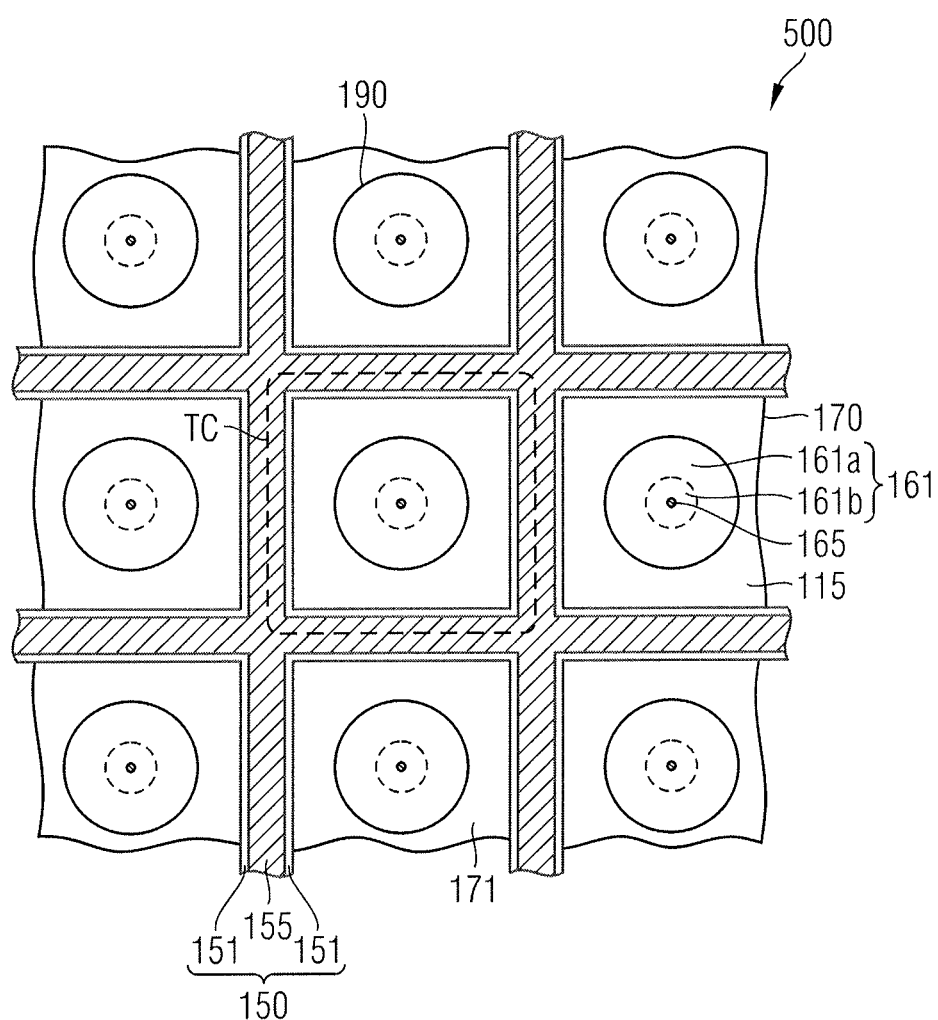
FIG. 6B is a schematic horizontal cross-sectional view of the semiconductor device portion of FIG. 6A along line B,C-B,C according to an embodiment concerning spicular field electrode structures and continuous buried gate electrodes.

FIG. 6B shows spicular compensation structures 190 arranged matrix-like in lines and rows and in meshes of a grid-shaped, continuous gate structure 150. According to another embodiment spicular compensation structures 190 may be arranged in lines with the compensation structures 190 in the odd compensation lines shifted to that in the even compensation lines by half the center-to-center distance along the compensation lines. The gate structure 150 is a buried and continuous structure.

In FIG. 6C the gate structure 150 is disrupted and includes a plurality of separated gate segments 150a arranged along parallel first gate lines and parallel second gate lines crossing the first gate lines, e.g., orthogonally. Second mesa sections 172 that may include portions of the source zones 110 as well as portions of the body zones 115 separate neighboring gate segments 150a from each other.

FIGS. 7A to 7D refer to the manufacture of a semiconductor device 500 such as a trench field plate FET as described above, wherein a plurality of identical semiconductor devices is formed on a common semiconductor substrate 500a.

The semiconductor substrate 500a may be a wafer, for example a monocrystalline silicon wafer. Outside the illustrated portion the semiconductor substrate 500a may include further doped and undoped sections, epitaxial semiconductor layers and previously fabricated insulating structures.

The semiconductor substrate 500a may include a semiconductor layer 100a, which may be formed, for example by epitaxial growth on a base substrate. Trenches 190a are introduced from a main surface 100a into the semiconductor substrate 500a, e.g., by a reactive ion etch. By thermal oxidation a thermally grown layer 161x is formed at a front side of the semiconductor substrate 500a.

Figure 7A:
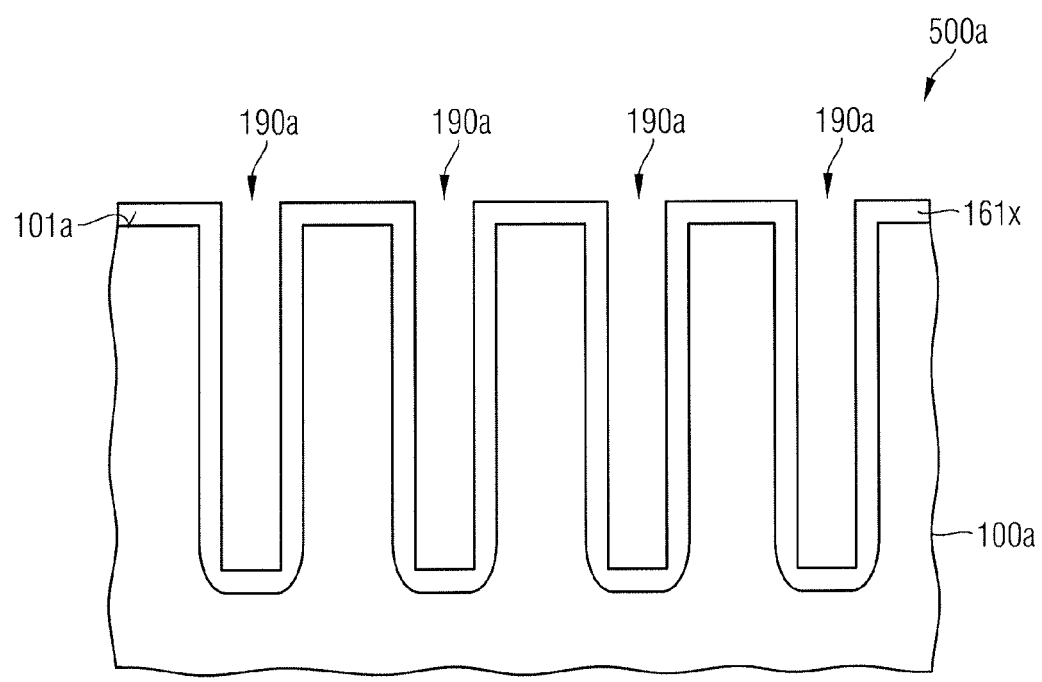
FIG. 7A is a schematic cross-sectional view of a portion of a semiconductor substrate for illustrating a method of manufacturing a semiconductor device in accordance with a further embodiment, after forming a thermally grown portion of a field dielectric.

FIG. 7A shows the trenches 190a that may have approximately vertical sidewalls. The trenches 190a may have a depth ranging from 1 to 45 µm, for example from 3 to 12 µm. According to an embodiment, the depth of the trenches is about 9 µm. The trenches 190a may be evenly spaced at a pitch from about 1 to 10 µm, for example from 3.5 to 4.5 µm. The width of the trenches 190a may range from 0.5 to 5 µm, for example from 2.5 to 3.5 µm.

The thermally grown layer 161x lines the trenches 190a and covers portions of a main surface 101a of the semiconductor layer 100a between the trenches 190a.

Silicon oxide is deposited by LPCVD, APCVD or PECVD using, for example, silane SH$_4$, TEOS, or TEOS in combination with ozone as precursor material. During and after deposition of the deposited layer 161y a heating treatment at a temperature below 1050° C., e.g., between 900° C. and 1025° C. may densify the deposited silicon oxide to some degree, but less than it would be densified in a heating treatment at 1100° C. for 30 min. During all following process steps, the temperature applied to the semiconductor substrate 500a is kept below the temperature at which the deposited layer 161y has been densified.

A conductive material, for example heavily doped polycrystalline silicon is deposited on the semiconductor substrate 500a to fill the trenches 190a. The deposited conductive material may be recessed to form a field electrode 165 in the trenches 190a.

Figure 7B:
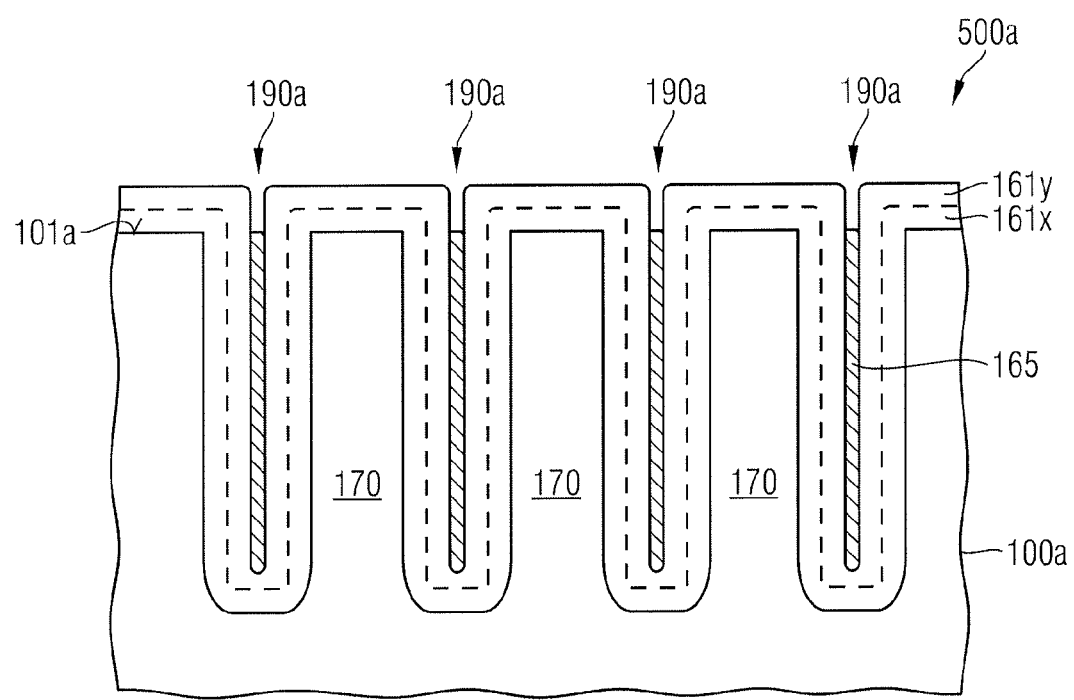
FIG. 7B is a schematic cross-sectional view of the semiconductor substrate portion of FIG. 7A, after depositing a deposited portion of the field dielectric and forming a field electrode.

FIG. 7B illustrates the trenches 190a filled with conductive material forming the field electrodes 165, the thermally grown layer 161x as well as the deposited layer 161y separating the field electrode 165 from the semiconductor layer 100a. Exposed edges of the etched-back conductive material may be approximately flush with the main surface 101a.

A sacrificial material may be deposited to fill resulting gaps above the conductive material. Then the semiconductor substrate 500a may be planarized at least up to the first surface 101, wherein portions of the thermally grown and deposited layers 161x, 161y in the trenches 190a form a field dielectric 161. A mask layer may be deposited on the planarized main surface 101a and may be patterned by photolithography to form an etch mask 710 with openings 712 exposing outer portions of the field dielectric 161, wherein the outer portions directly adjoin portions of the semiconductor layer 100a between neighboring ones of the trenches 190a. The outer portions may extend from the vertical edge between the semiconductor layer 100a and the field dielectric 161 up to at least 200 nm, for example about 350 nm into a direction of the corresponding field electrode 165. The etch mask 710 covers the field electrodes 165 and further portions of the field dielectric 161 directly adjoining the field electrode 165. Using the etch mask 710 the material of the field dielectric 161 is recessed selectively against the semiconductor material of the semiconductor layer 100a.

Figure 7C:
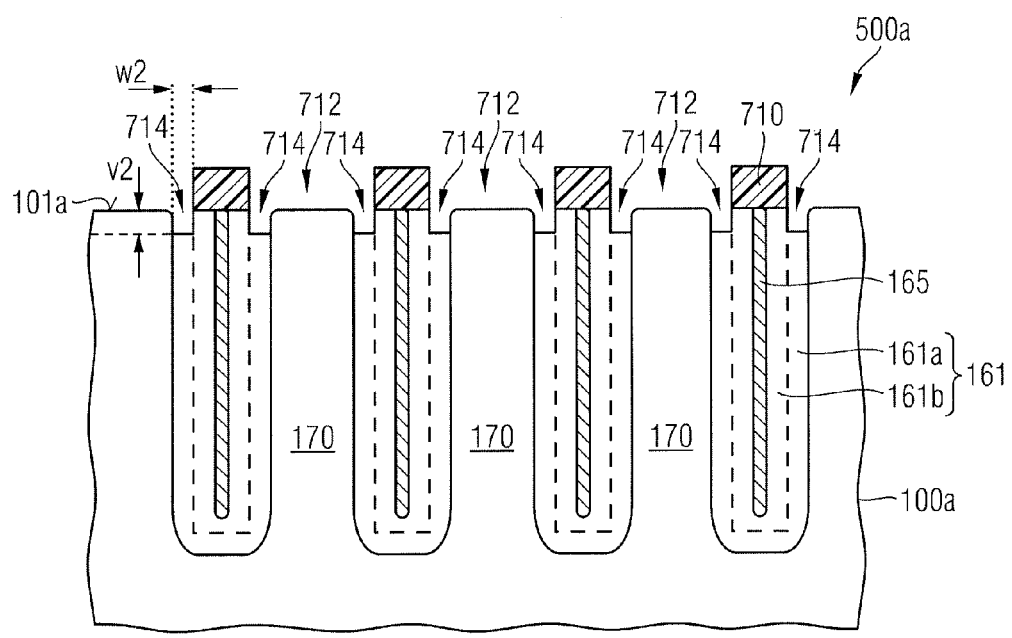
FIG. 7C is a schematic vertical cross-sectional view of the semiconductor substrate portion of FIG. 7B, after recessing the field dielectric for forming gate pockets.

FIG. 7C shows the etch mask 710 covering central portions of compensation structures 190 including the field electrode 165 and the field dielectric 161. The total thickness of the field dielectric 161 including the thermally grown portion 161a and the not fully densified deposited portion 161b may range from 0.7 to 2.0 μm, for example from 0.9 to 1.2 μm. The material of the etch mask 710 has etch properties different from the etch properties of the material(s) of the field dielectric 161 and the semiconductor layer 100a. The openings 712 in the etch mask 710 expose outer portions of the compensation structures 190 directly adjoining semiconductor mesas 170 formed from sections of the semiconductor layer 100a between neighboring compensation structures 190. In the outer periphery of the compensation structures 190 pockets 714 extend into peripheral portions of the field dielectric 161. The pockets 714 may have a vertical extension v2 of 200 nm to 1 μm, for example 600 nm, and a width w2 of about 200 nm to 600 nm, e.g. 300 nm to 500 nm, by way of example.

According to another embodiment the pockets 714 may be formed by an etch that selectively recesses the not fully densified deposited portion 161b with respect to the thermally grown portion 161a and the semiconductor layer 100a and without a mask covering the thermally grown portion 161a.

The etch mask 710 may be removed and a gate dielectric 151 may be formed by thermal oxidation, by deposition of a dielectric material, or by a combination of both.

According to an embodiment, a thermal portion of the gate dielectric 151 may be formed by thermal oxidation of the material of the semiconductor layer 100a at a temperature below or equal 1000° C. Then a non-thermal portion of the gate dielectric 151 may be formed by LPCVD, APCVD, or PECVD, wherein silicon oxide is deposited using, e.g., TEOS as precursor material. A conductive material is deposited that fills the remaining space in the pockets 714.

Figure 7D:
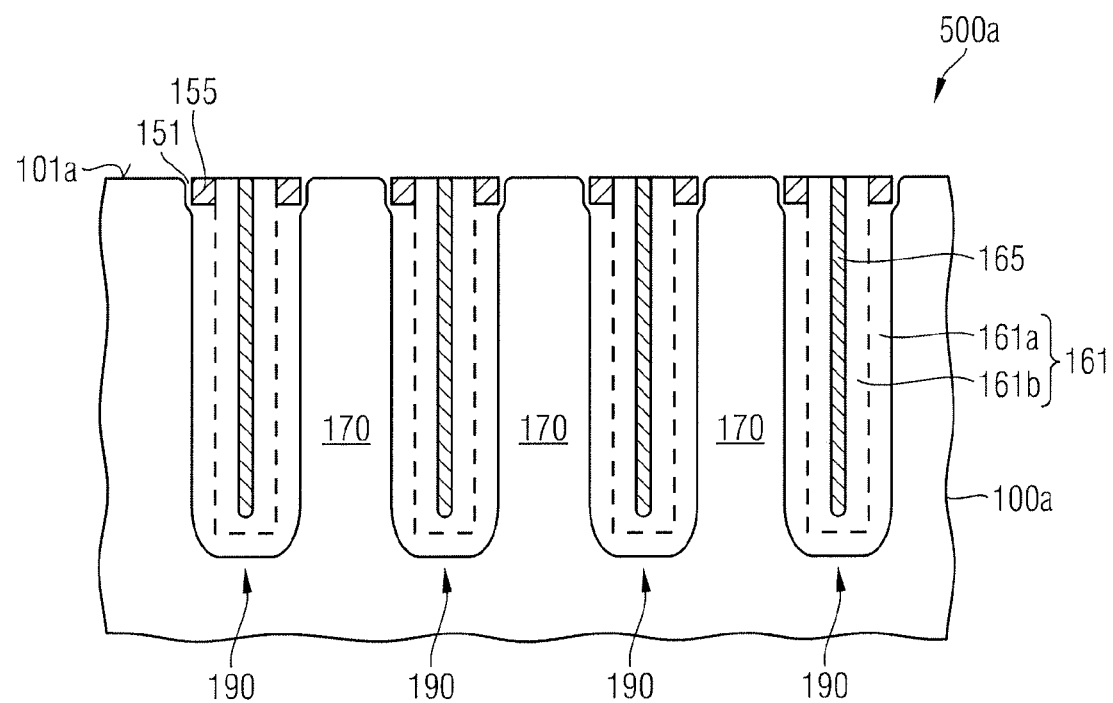
FIG. 7D is a schematic vertical cross-sectional view of the semiconductor substrate portion of FIG. 7C, after forming a gate electrode.

FIG. 7D shows a gate electrode 155 resulting from the deposited conductive material in the pockets 714 as well as a gate dielectric 151 insulating the gate electrode 155 from the semiconductor layer 100a. The conductive material may be highly doped polycrystalline silicon. According to another embodiment, the gate electrodes 155 consist of or include one or more metal structures, e.g., a titanium nitride (TiN) interface layer and/or a fill layer of tungsten (W).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
   compensation structures extending from a first surface into a semiconductor portion, wherein sections of the semiconductor portion between neighboring ones of the compensation structures form semiconductor mesas; and
   a field electrode in the compensation structures, wherein a field dielectric separating the field electrode from the semiconductor portion comprises a thermally grown portion, which directly adjoins the semiconductor portion, and a not fully densified deposited portion with a lower density than the thermally grown portion.

2. The semiconductor device of claim 1, wherein the thermally grown portion is thermal silicon oxide.

3. The semiconductor device of claim 1, wherein the not fully densified deposited portion is a silicon oxide based on a deposition process using tetraethyl orthosilicate as precursor material.

4. The semiconductor device of claim 1, wherein the not fully densified deposited portion has a lower density than after an anneal at 1100° Celsius for 30 minutes.

5. The semiconductor device of claim 1, wherein the not fully densified deposited portion has a density equal to or lower than after an anneal at 1050° Celsius for 30 minutes.

6. The semiconductor device of claim 1, wherein in an etch solution containing a mixture of 33 wt. % ammonium fluoride $NH_4F$ and 4.15 wt. % hydrofluoric acid, an etch selectivity between the not fully densified deposited portion and the thermally grown portion is between (2:1) and (4:1).

7. The semiconductor device of claim 1, wherein in an etch solution containing an mixture of 33 wt. % ammonium fluoride $NH_4F$ and 4.15 wt. % hydrofluoric acid, an etch selectivity between the not fully densified deposited portion and a fully densified deposited silicon oxide based on tetraethyl orthosilicate as precursor material is between (2:1) and (4:1).

8. The semiconductor device of claim 1, wherein a direction of mechanical stress induced into the semiconductor portion by the not fully densified deposited portion is opposite to a direction of mechanical stress induced into the semiconductor portion by the thermally grown portion.

9. The semiconductor device of claim 1, wherein a ratio of a mean thickness of the thermally grown portion to a mean thickness of the not fully densified deposited portion is at least 1:1 and at most 9:1.

10. The semiconductor device of claim 1, further comprising
    a gate structure comprising a gate electrode, wherein a gate dielectric separates the gate electrode from the semiconductor mesas and wherein first mesa sections of the semiconductor mesas separate the gate structure from the compensation structures.

11. The semiconductor device of claim 1, further comprising
    a gate electrode in the compensation structures, wherein a gate dielectric separates the gate electrode from the semiconductor mesas and an intermediate dielectric separates the gate electrode and the field electrode.

12. The semiconductor device of claim 11, wherein a width of the gate electrode corresponds to a width of the thermally grown portion.

13. The semiconductor device of claim 11, wherein the intermediate dielectric separates the gate and field electrodes along a direction parallel to the first surface and in each compensation structure two segments of the gate electrode are formed on opposite sides of an intermediate field electrode.

14. The semiconductor device of claim 11, wherein the gate dielectric comprises a thermal portion, which directly adjoins the semiconductor portion, and a not fully densified non-thermal portion having a lower density than the thermally grown portion.

15. The semiconductor device of claim 1, wherein the compensation structures are parallel stripes extending in a direction parallel to the first surface.

16. The semiconductor device of claim 1, wherein the compensation structures are arranged in lines extending in a direction parallel to the first surface and each line comprises a plurality of the compensation structures.

17. The semiconductor device of claim 1, further comprising:
a first load electrode and an interlayer dielectric directly adjoining the first surface and separating the first load electrode and the semiconductor portion, and
trench field plate contact structures extending through the interlayer dielectric and between two segments of the gate electrode of the same compensation structure and electrically connecting the first load electrode with the field electrode.

18. The semiconductor device of claim 1, wherein the first load electrode is electrically connected with the field electrode.

19. The semiconductor device of claim 1, further comprising:
a drift zone formed in the semiconductor portion, wherein the drift zone forms first pn junctions with body zones formed in the semiconductor mesas and the body zones form second pn junctions with source zones in the semiconductor mesas.

20. The semiconductor device of claim 19, further comprising:
a field stop zone formed in the semiconductor portion, wherein the field stop zone and the drift zone formed a unipolar homojunction and a mean net dopant concentration in the field stop zone is at least two times as high as in the drift zone.

21. The semiconductor device of claim 19, wherein the drift zone contains metallic recombination centers.

22. A trench field plate field effect transistor comprising:
compensation structures extending from a first surface into a semiconductor portion, wherein sections of the semiconductor portion between neighboring ones of the compensation structures form semiconductor mesas; and
a field electrode in the compensation structures, wherein a field dielectric separating the field electrode from the semiconductor portion comprises a thermally grown portion, which directly adjoins the semiconductor portion, and a not fully densified deposited portion having a lower density than the thermally grown portion.

* * * * *